United States Patent [19]

Latz et al.

[11] Patent Number: 5,026,471
[45] Date of Patent: Jun. 25, 1991

[54] DEVICE FOR COATING A SUBSTRATE

[75] Inventors: Rudolf Latz, Rodgau; Michael Scherer, Rodenbach, both of Fed. Rep. of Germany

[73] Assignee: Leybold Aktiengesellschaft, Hanau, Fed. Rep. of Germany

[21] Appl. No.: 443,674

[22] Filed: Nov. 29, 1989

[30] Foreign Application Priority Data

Sep. 7, 1989 [DE] Fed. Rep. of Germany ....... 3929695

[51] Int. Cl.$^5$ .............................................. C23C 14/34
[52] U.S. Cl. .......................... 204/298.19; 204/298.16; 204/298.2; 204/192.12
[58] Field of Search .................... 204/298.07, 298.11, 204/298.16, 298.17, 298.18, 298.19, 298.20, 298.21, 298.22, 192.12

[56] References Cited

U.S. PATENT DOCUMENTS

| | | | |
|---|---|---|---|
| 3,956,093 | 5/1976 | McLeod | 204/298.2 X |
| 4,198,283 | 4/1980 | Class et al. | 204/298.19 X |
| 4,444,643 | 4/1984 | Garrett | 204/298.2 |
| 4,572,842 | 2/1986 | Dietrich et al. | 204/298.07 X |
| 4,601,806 | 7/1986 | Winz | 204/298.19 X |
| 4,810,346 | 3/1989 | Wolf et al. | 204/298.19 X |

FOREIGN PATENT DOCUMENTS 3738845  5/1989  Fed. Rep. of Germany .

*Primary Examiner*—Nam X. Nguyen
*Attorney, Agent, or Firm*—Felfe & Lynch

[57] ABSTRACT

A device for coating a substrate 1 with electrically conductive materials 2 includes a direct current and/or alternating current source 10, 38 which is connected to an electrode 44 disposed in an evacuable coating chamber 15, 15a, 15b and electrically connected to a target 43 which is to be sputtered and the sputtered particles of which are deposited on the substrate a process gas can be introduced into the coating chamber 15, 15a, 15b and wherein toroidal magnetic fields penetrate the target and the magnetic flux lines thereof exit from the surface of the target in the area of the magnetic poles 45, 46, 47. The target 43 has essentially an oval layout enclosed by a dark space shield 34 having circumferential front 35 which faces the substrate 1 and is slightly set back behind the front of the target 34. The magnet arrangement which is disposed in a cathode trough 4 and supported on a yoke 48 includes a center row of small magnets 46 extending in longitudinal direction of the target, a further continuous row of small magnets 45, 47 disposed at the edge of the yoke and two round magnets each of which is at the respective end of the center row of magnets 46.

10 Claims, 3 Drawing Sheets

DEVICE FOR COATING A SUBSTRATE

BACKGROUND OF THE INVENTION

The invention relates to a device for coating a substrate, preferably with aluminum oxide, using a direct current source and/or an alternating current source which is connected to an electrode disposed in an evacuable coating chamber. The electrode in turn is electrically connected to a target to be sputtered and the sputtered particles thereof are deposited on the substrate, for example, a plastic element. A process gas can be introduced into the coating chamber and toroidal magnetic fields penetrate the target and the flux lines exit from the surface of the target in the area of the magnetic poles.

A cathode sputtering device is known (German OS 27 07 144; Sloan Technology Corp.) including a cathode which has one surface to be sputtered, and a magnetic device at the side close to the cathode and at the side for generating magnetic flux lines opposite the surface to be sputtered. At least a few of these flux lines enter the surface to be sputtered to exit it again a intersections which are spaced apart and between which the flux lines form continuously archlike segments spaced from the surface to be sputtered. Together with the flux lines, the surface forms a boundary for a closed area thus forming a tunnel-like area which is located above a thus defined path on the surface to be sputtered. Charged particles show a tendency of being restrained in the tunnel-like area where they move along. The invention also includes an anode in the vicinity of the cathode and a connection of the cathode and the anode to a source of an electric potential whereby at least the surface to be sputtered is within an evacuable container.

This device includes a moving device for generating a relative movement between the magnetic field and the surface to be sputtered while maintaining the spatial relationship. The aforementioned defined path covers a surface area which is greater than the surface area occupied by the resting path.

Further, an arrangement is known for coating a substrate with a dielectric (P 38 21 207.2, Leybold AG) having a direct current source which is connected to an electrode which in turn is electrically connected to a target to be sputtered. The sputtered particles combine with a substance to be supplied so as to form a compound which is deposited on the substrate. Toroidal magnetic fields penetrate the target and the flux lines exit the surface of the target in the area of the magnetic pole. This arrangement is provided with an alternating current source the output voltage of which overrides direct voltage of the direct current source. The electric power of the alternating current source which is supplied to the electrode corresponds to 5% to 25% of the power supplied to the electrode from the direct current source.

Finally, a magnetron sputtering cathode for vacuum coating systems having a circular target plate made of the material to be sputtered was suggested (DE 36 19 194, to which U.S. Pat. No. 4,746,417 corresponds, Leybold AG) which includes at least one magnet system disposed behind the target plate. This magnet system includes two self-contained rows of permanent magnets nesting in one another and the magnets of each row have the sam pole position whereas the pole position of the magnets of the two rows is opposite with respect to one another such that above the target plate the magnetic field lines form at least one self-contained tunnel starting at the one row of magnets and returning to the other row of magnets. The invention further includes a driving device for continuously rotating the magnet system around the center axis of the target plate. A first magnet system for generating a first magnetic tunnel which is essentially concentric to the rotating axis is disposed at the edge of the target plate. An eccentrically offset second magnet system is disposed between the rotating axis and the first magnet system. It generates a second magnetic tunnel covering only one sector of the target plate such that when both magnet systems perform one common rotation, the surface elements of the target plate are subject to the product of residence time and intensity in a way that in the center area the target plate is subject to a regular abrasion whereas the abrasion is stronger at the edge so that a substrate field opposite the target plate is uniformly coated.

SUMMARY OF THE INVENTION

It is an object of the present invention to provide an arrangement for a stable operation of complicated, reactive sputtering processes permitting particularly the manufacture of compound layers such as $Al_2O_3$, $SiO_2$, $Si_3O_4$, ITO, $TiO_2$, $Ta_2O_5$ with a high sputtering rate and quality.

The target essentially has a longitudinal, rectangular form and the diametrically opposed narrow ends thereof are archlike chamfered at the ends to form an oval. The target is enclosed by a dark space shield, the circumferential edge or front surface of which faces the substrate is slightly set back behind the front of the target. The magnet arrangement which is disposed in a cathode trough and supported on a yoke consists of a center row of small magnets extending in longitudinal direction of the target, a further continuous row of small magnets disposed at the edge of the yoke and two round magnets disposed at respective ends of the center row of magnets.

Preferably, the magnets are supported on a yoke which has a width and length smaller than the space bounded by the cathode trough. The pin of a motor-driven eccentric or crank mechanism engages a recess in the yoke thus moving the yoke back and forth inside the trough space.

DETAILED DESCRIPTION OF THE PREFERRED EMBODIMENT

Figure 1:
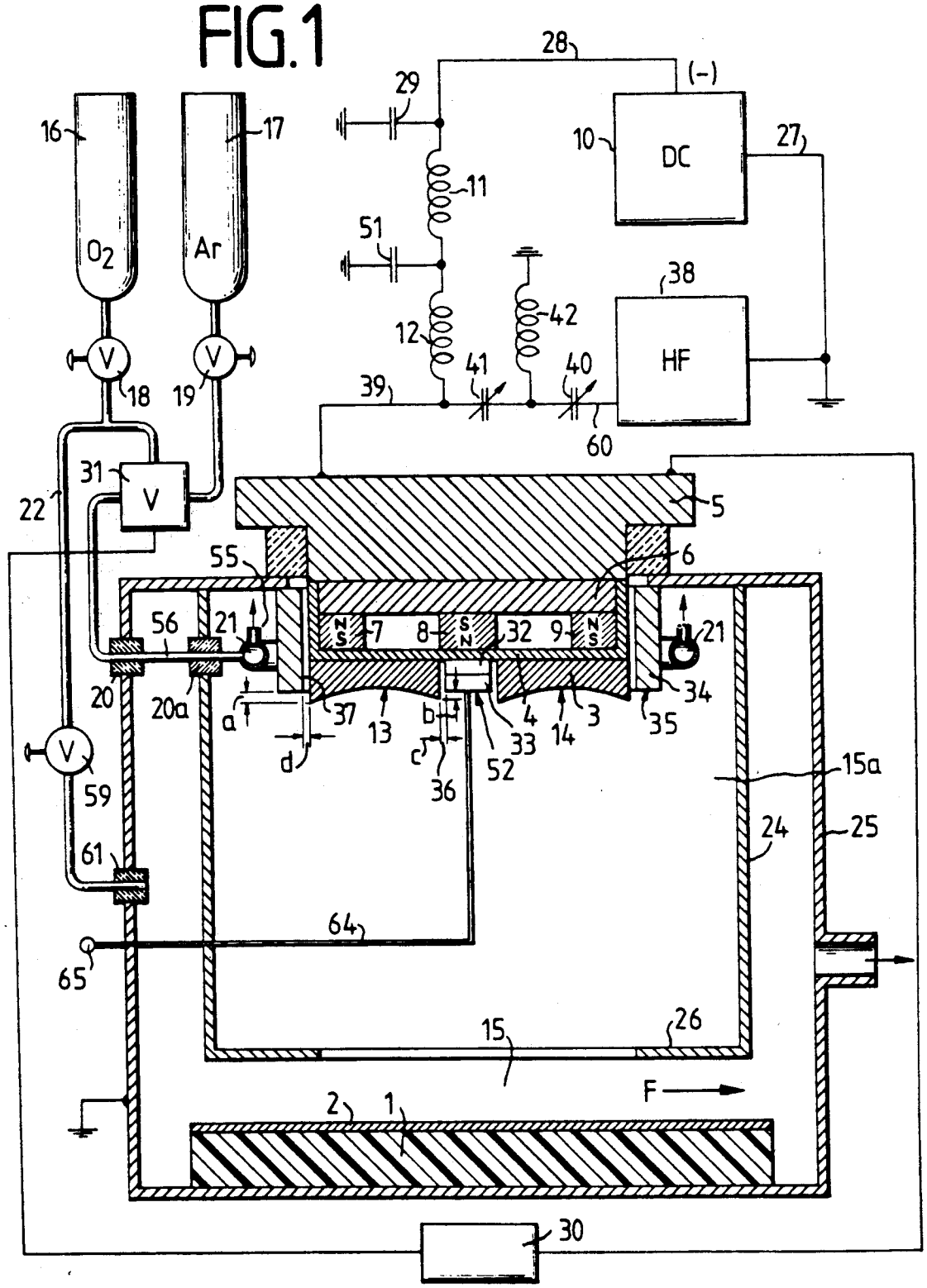
FIG. 1 is a cross section of a sputtering system having an ovally shaped target and a second target is mounted on a centrally disposed insulator.

The drawing (FIG. 1) shows a substrate 1 to be provided with a thin metal layer 2. A target 3 to be sputtered is opposite this substrate 1. An element 4 with a U-shaped cross section, a so-called cathode trough connects the annular target 3 which encloses an insulator 32 including a central target 33 to an electrode 5. The electrode rests on a yoke 6 which encloses three rows of permanent magnets 7, 8, 9 between itself and the cathode trough 4.

The polarities of the poles of the three permanent magnets 7, 8, 9 directed onto the target alternate such that the respective south poles of the two outer rows 7, 9 of the permanent magnets together with the north pole of the center row 8 of permanent magnets generate an approximately circular magnetic field across the target 3. This magnetic field condenses the plasma in front of the target 3 such that at the point where the magnetic fields reach the maximum of their arches, the plasma has its greatest density. The ions in the plasma are accelerated by an electric field which is generated by a direct current supplied by a direct current source 10. The negative pole of this direct current source 10 is connected to the electrode 5 via two inductors 11, 12 and the electric line 39. The electric field stands vertical on the surface of the target 3 and accelerates the positive ions of the plasma in direction toward the surface of this target 3. A more or less large number of atoms or particles is thus ejected from the target 3, particularly from those areas (or sputtering trenches) 13, 14 where the horizontal component of the magnetic field has its maximum. The sputtered atoms or particles travel in direction toward the substrate 1 where they are deposited as a thin layer 2.

In a chamber 15, the metal particles ejected from the target react on the substrate surface with certain gases which are supplied from gas cylinders 16, 17 through gas supply lines 23, 56 into a chamber 15a via valves 18, 19, 31, 59 and seals 20, 20a to a circular line 21 which is connected to the latter and has nozzles 55. This chamber 15a is formed by two containers 24, 25 of which the one container 25 encloses the substrate 1 whereas the other container 24 ends in front of the substrate 1 forming a diaphragm 26. Both containers 24, 25 and, hence, the substrate 1, which rests on the bottom of container 25 are electrically connected to ground. The second terminal 27 of the direct current source 10 is also electrically connected to ground. The first terminal 28 of this direct current source is in addition to the inductors 11, 12 also connected to the capacitors 29, 51 which in turn are connected to ground.

Via a gas distributing system and a circular line 21 having nozzles 55 and surrounding the cathode 5, the gas is advantageously supplied to the second container 24 as well as to the interspace 15b between the first and the second chambers 24, 25.

In order to control the represented arrangement, a process computer 30 can be provided which processes the data and releases control commands. The values of the partial pressure measured in the process chamber can be entered in this process computer, for example. Based on this and other data, it can control the gas flow via the piezo valve 31, for example, and adjust the voltage in the cathode 5. This process computer is also able to control all other variables such as the cathode current and the magnetic field strength. Since process computers of this kind are known a description of their design can be omitted.

As it can be seen in FIG. 1, the cathode trough 4 as well as the annular target 3 including the central target 33 are enclosed by a dark space shield 34. The front 35 thereof which is on the side of the substrate is set back behind the target 3 by the distance a (e.g. 2 mm). Further, between the insulator 32 inclusive of the central target 33 and the radial inside surface of the target 3, there is an annular gap 36 (c = 1 mm). Between the radial outside surface of the target 3 and the inside of the dark space shield 34 there is another annular gap 37 (d = 2 mm). Finally, the front surface 52 of the rodlike central target 33 which is on the substrate side is set back with respect to the annular front of the target 3 by a small distance b (e.g. 1 mm).

In addition to the DC-current source 10, there is also a HF-current source 38 provided for the power supply line 39 and 60 including interposed capacitor 40, 41 and an inductor 42 which permits supplying an alternating current to the electrode 5.

The device according to FIG. 1 ensures that a reactive gas discharge burns stably in an argon-reactive gas atmosphere in front of the magnetron cathode 5 with a target 3. This discharge can either be a direct voltage discharge, a high frequency discharge or an overlapping of both.

The target 3 is configured (which cannot be seen in the drawing of FIG. 1) as a longitudinal target (rectangular target) the ends of which are archlike chamfered, i.e. the longitudinal target has an oval layout.

This is particularly recommended for a pure DC-discharge. Such a specially formed target can be mounted on either rectangular standard cathode troughs or on special cathode troughs 4 having arches.

Figure 4:
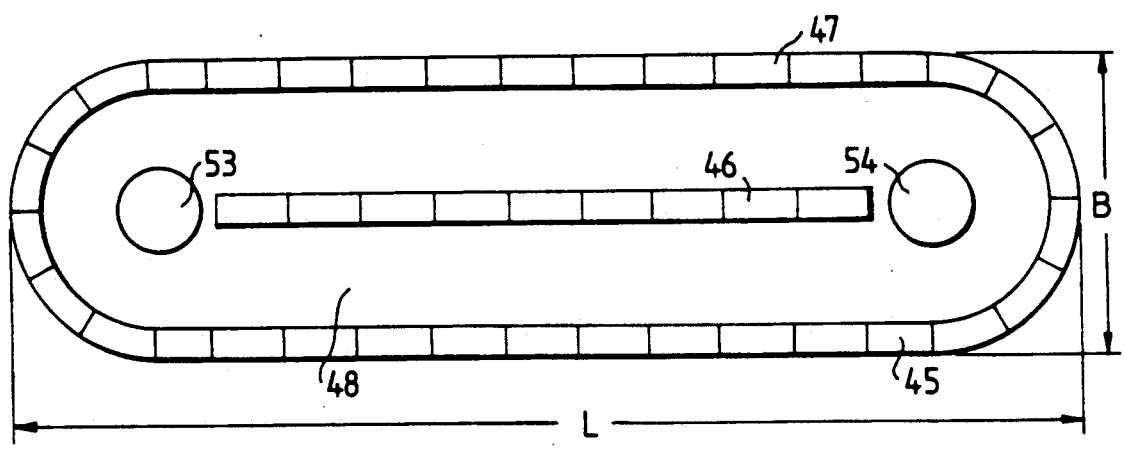
FIG. 4 is a top view of the magnet arrangement of FIG. 2 including two round magnets at the diametrically opposed ends of the oval magnet yoke.

In a special embodiment the magnetic field is formed such that the sputtering area on the target is as large as possible. Particularly for longitudinal cathodes it is recommended to use a magnetic field which is formed by two round magnets 53, 54 which are disposed on diametrically opposed ends of the yoke 48 (FIG. 4).

In this embodiment, the magnetic field is distinguished by the following particulars a. The selected magnets 45, 46, 47 are very small (e.g. c = 5 mm) and have a high magnetic field strength (Vacudym magnets).

b. Two round magnets 53, 54 of an appropriate size and strength are located at the two ends of the center row of magnets 46 such that the target material is sputtered off up to the edge at regular discharge voltages.

The magnets 53, 54 are substantially larger than the magnets 46, having a diameter about three times the width of magnets 46.

Figure 2:
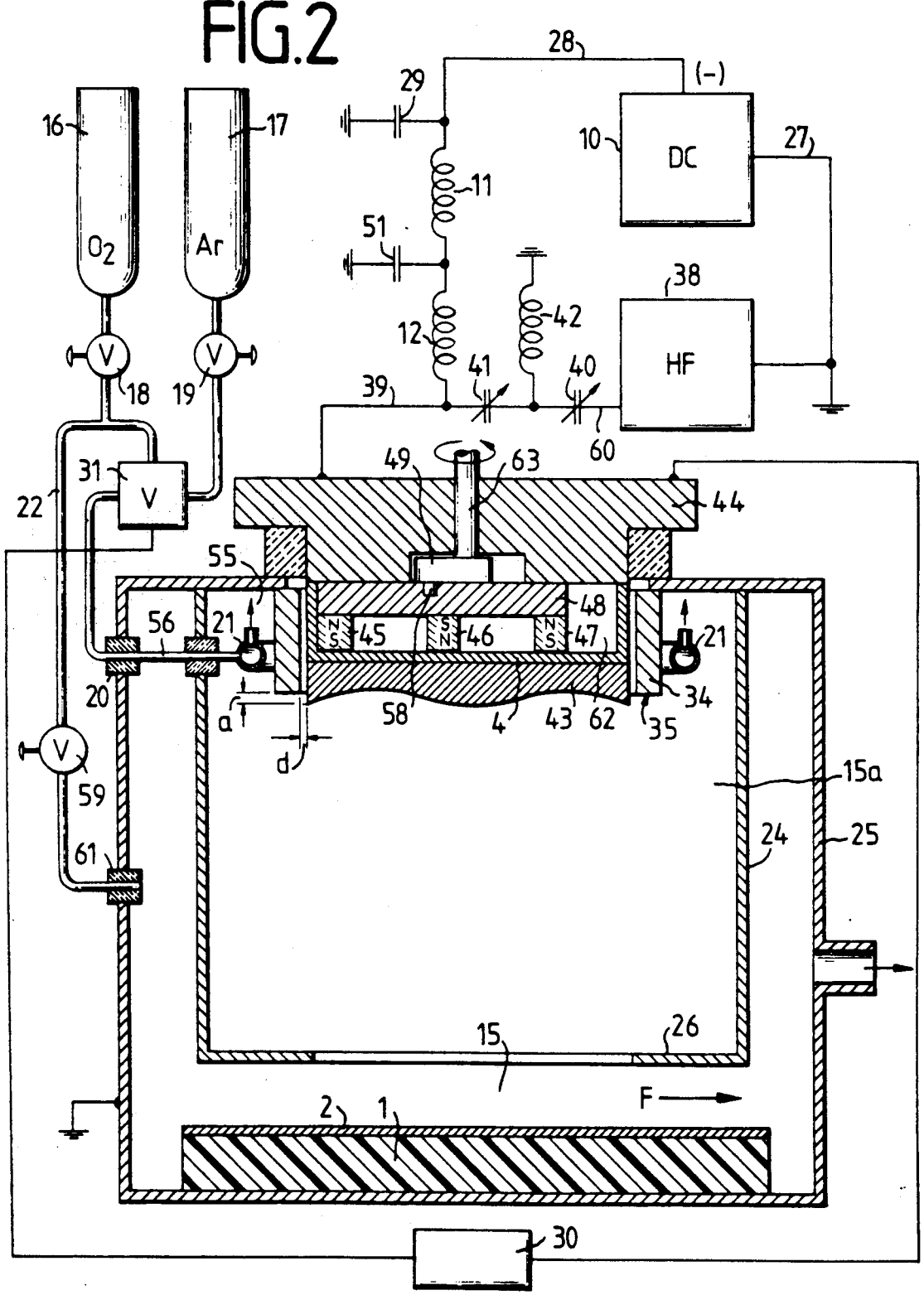
FIG. 2 is a cross-section of an embodiment of the sputtering system having a magnet yoke which can be moved eccentrically in the cathode trough.

In the device of FIG. 2, the target 43 is disposed on the electrode 44 together with the U-shaped yoke and the cathode trough 4 whereas the permanent magnets or the magnet row 45, 46, 47 with the yoke 48 are coupled to the pin 58 of a crank mechanism 49. The latter can be driven by a shaft 50 and sets the yoke 48 into an oscillating motion within the inside walls of the cathode trough 4.

In case of longitudinal cathodes, it is hence possible when using a chamfered target 43 and the described magnet arrangement (FIG. 4) to move the magnetic field in at least two ways such that depositions on the target surface are avoided even during reactive sputtering. This is made possible by a. a lateral rocking motion of the entire magnetic yoke 48 in the cathode trough 4 and b. a simultaneous movement of the magnet yoke 48 in the cathode trough in longitudinal direction thereof such that the magnetic arrangement 45, 46, 47 is moved back and forth in lateral as well a in longitudinal direction.

In case of reactive sputtering, the above arrangement also prevents the formation of insulating layers on the target surface which could cause discharge instabilities.

Such instabilities should be absolutely avoided when reactively sputtering, however, experience proved this to be hardly possible.

This is particularly required for a few critical, reactive sputtering processes (such as the processes for producing $Al_2O_3$, $SiO_2$, $Si_3N_4$, ITO, $TiO_2$, $Ta_2O_5$), especially, when high sputtering rates are desired.

Figure 3:
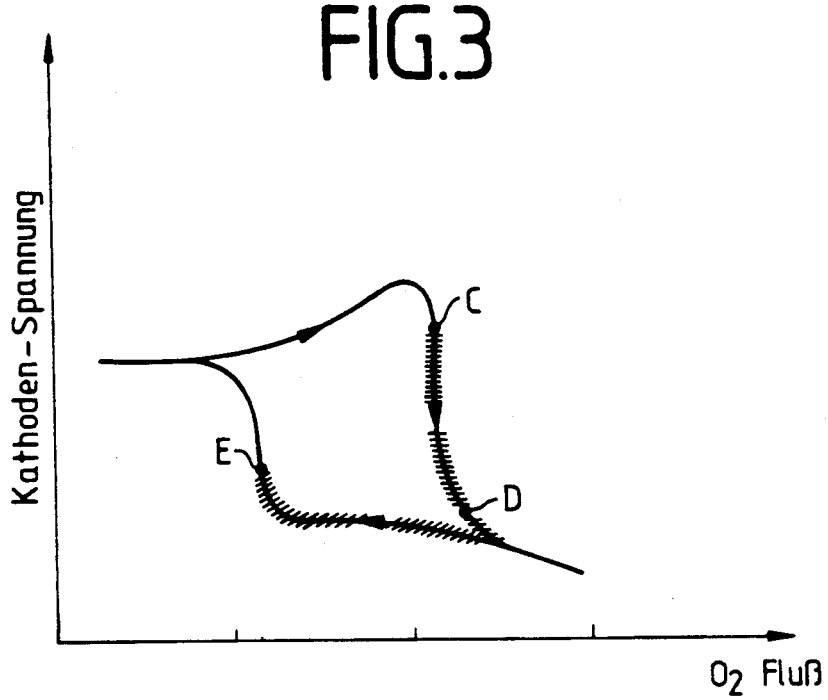
FIG. 3 is a diagrammatic representation of the cathode voltage as a function of the $O_2$-current during the reactive sputtering of $Al_2O_3$.

Considering the cathode voltage as a function of the $O_2$ current, for example, when reactively sputtering $Al_2O_3$ results in the course as represented in the diagram (FIG. 3).

As a function of the $O_2$-current, the coating rate shows a qualitatively similar course. The curves show a different dependency, depending on whether the $O_2$-current develops from smaller to larger currents or the reverse way (hysteresis effect) when taking up the curve.

Stoichiometric $Al_2O_3$ is separated in the area of the two curves with the hatched lines. In order to obtain a high sputtering rate, it is desirable to carry out the sputtering at the operating point C. This, however, requires further steps since the $U=f(O_2)$ dependency is much too steep and the process drifts away within a short period of time ($<1$ sec).

A special control for cathode voltage reactive gas flow permits stabilizing the operating point C (in the diagram) even during the reactive sputtering of $Al_2O_3$.

Taking all steps into account, an $Al_2O_3$ reactive process can be maintained stable over several hours at the operating point C during a pure HF-sputtering as well as during an overlapping of HF and DC sputtering. Sputtering rates of 30 Å/sec can thus be achieved without problems.

In order to ensure quick control reaction, it is possible to prescribe two characteristic features while carrying out the control:
 a. increasing characteristic line
 b. decreasing characteristic line In order to minimize inertia when supplying the reactive gas
 1. a piezo valve 31 is used
 2. the pipe 56 between the piezo valve 31 and the outlet opening 55 of the gas is kept as short as possible and
 3. the diameter of the pipe 56 and the circular pipe 21 must not be too small ($>5$ mm).

The process gas argon can be supplied either via the same pipe 56 as the reactive gas or, in case of in-line systems, outside the covering box 24 via line 57, for example.

We claim:

1. Cathode sputtering device for coating a substrate, comprising;
 an electrode connected to a current source,
 an evacuable chamber,
 means for introducing a process gas into said chamber,
 a cathode through containing a yoke on said electorde,
 a substantially oval target supported on said trough and disposed in said chamber, said target being electrically connected to said electrode, said target having a front surface which faces the substrate,
 a magnet arrangement supported on said yoke in said trough and comprising a center row of magnets extending in the longitudinal direction of the target, a continuous row of magnets disposed about the circumference of the yoke, and a pair of round magnets located at respective ends of the center row, said magnets being arranged so that circular magnetic fields are generated across the target to trap plasma, whereby plasma is densest at said front surface,
 a dark space shield which surrounds said target but is recessed from the front surface thereof.

2. Device in accordance with claim 1 wherein magnets are supported on a yoke the width and length of which are smaller than the trough bounded by the cathode trough wherein the pin of a motor-driven eccentric or crank mechanism engages a recess in the yoke thus making the yoke move back and forth inside the trough.

3. Device in accordance with claim 2 wherein a crank mechanism driving the yoke moves the latter together the magnets disposed thereon in longitudinal direction of the cathode trough as well as transversely thereto.

4. Device in accordance with claim 1 further comprising control means which controls the supply of the reactive gas via a valve such that the discharge voltage remains constant.

5. Device in accordance with claim 1 further comprising a slot-like recess provided in a center part of the target which is sputtered and a ledge made of a metallic material and forming a central target rigidly disposed on an electric insulator in said recess, wherein a circumferential gap is provided between ledge and the target which is sputtered.

6. Device in accordance with claim 5, further comprising an electric conductor which connects the ledge to an externally applied electric potential.

7. Device in accordance with claim 1 further comprising means for movably supporting and guiding the magnets together with the yoke while spaced-apart from the substrate, and means for interrupting the reactive gas supply during the adjustment of the magnets.

8. Device in accordance claim 1 further comprising means for adjusting the desired value of the cathode discharge voltage at the reactive gas control such that the layer property of the substrate remains constant.

9. Cathode sputtering device as in claim 1 wherein said round magnets have a diameter which is substantially larger than the width of the magnets in the center row, where the width is measured transversely of the longitudinal direction of the target.

10. Cathode sputtering device as in claim 9 wherein the diameter of the round magnets is about three times the width of the magnets in the center row.

* * * * *